(12) United States Patent
Chiang et al.

(10) Patent No.: US 10,858,869 B2
(45) Date of Patent: Dec. 8, 2020

(54) HINGE ASSEMBLY AND ELECTRONIC DEVICE USING THE SAME

(71) Applicant: ASUSTeK COMPUTER INC., Taipei (TW)

(72) Inventors: Tsung-Ju Chiang, Taipei (TW); Hung-Chieh Wu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 165 days.

(21) Appl. No.: 15/958,027

(22) Filed: Apr. 20, 2018

(65) Prior Publication Data
US 2018/0305961 A1  Oct. 25, 2018

(30) Foreign Application Priority Data

Apr. 25, 2017 (TW) .............................. 106113828 A

(51) Int. Cl.
| | |
|---|---|
| *E05D 3/18* | (2006.01) |
| *G06F 1/16* | (2006.01) |
| *E05D 3/06* | (2006.01) |
| *H05K 5/02* | (2006.01) |

(52) U.S. Cl.
CPC ................. *E05D 3/18* (2013.01); *E05D 3/06* (2013.01); *G06F 1/1681* (2013.01); *E05Y 2201/62* (2013.01); *E05Y 2900/606* (2013.01); *G06F 1/1618* (2013.01); *H05K 5/0226* (2013.01)

(58) Field of Classification Search
CPC .... E05D 3/06; E05D 3/12; E05D 3/14; E05D 3/18; G06F 1/1681; G06F 1/1618; H05K 5/0226

USPC ................................... 16/366, 368, 369, 370
See application file for complete search history.

(56) References Cited

U.S. PATENT DOCUMENTS

| | | | | |
|---|---|---|---|---|
| 1,484,093 A | * | 2/1924 | Soss | ........................ E05D 3/186 16/358 |
| 1,688,996 A | * | 10/1928 | Soss | ........................ E05D 3/186 16/358 |
| 1,925,209 A | * | 9/1933 | Schwartz | .................. E05D 3/18 16/358 |

(Continued)

FOREIGN PATENT DOCUMENTS

| | | |
|---|---|---|
| CN | 105278627 A | 1/2016 |
| KR | 10-1452867 B1 | 10/2014 |

*Primary Examiner* — Jeffrey O'Brien
(74) *Attorney, Agent, or Firm* — McClure, Qualey & Rodack, LLP

(57) ABSTRACT

A hinge assembly is provided. The hinge assembly includes a rotating shaft structure, a first movable assembly and a second movable assembly. The rotating shaft structure includes a first rotating part and second rotating part. The first rotating part coaxially rotates relative to the second rotating part. The first movable assembly includes a first connecting member and a first moving member. The first moving member is movably connected to the first connecting member. The first movable assembly is connected to the first rotating part to rotate with the first rotating part simultaneously. The second movable assembly includes a second connecting member and a second moving member. The second moving member is movably connected to the second connecting member. The second movable assembly is connected to the second rotating part to rotate with second rotating part simultaneously.

3 Claims, 14 Drawing Sheets

(56) References Cited

U.S. PATENT DOCUMENTS

| | | | | |
|---|---|---|---|---|
| 1,984,092 | A * | 12/1934 | Soss | E05D 3/16 16/369 |
| 2,021,702 | A * | 11/1935 | Soss | E05D 3/16 16/369 |
| 3,673,635 | A * | 7/1972 | Cencioni | E05D 3/06 16/358 |
| 3,881,221 | A * | 5/1975 | Schmidt | E05D 3/186 16/366 |
| 4,736,491 | A * | 4/1988 | Mertes | E05D 3/18 16/358 |
| 6,223,393 | B1 * | 5/2001 | Knopf | G06F 1/1618 16/366 |
| 7,299,523 | B2 * | 11/2007 | Zou | G06F 1/1616 16/277 |
| 8,713,759 | B2 * | 5/2014 | Cai | G06F 1/1681 16/366 |
| 8,813,312 | B2 * | 8/2014 | Song | G06F 1/1601 16/225 |
| 9,021,657 | B2 * | 5/2015 | Park | H05K 5/0226 16/354 |
| 9,047,055 | B2 * | 6/2015 | Song | E05D 3/14 |
| 9,173,287 | B1 * | 10/2015 | Kim | H05K 1/028 |
| 9,360,896 | B2 * | 6/2016 | Lim | G06F 1/1681 |
| 9,562,380 | B2 | 2/2017 | Song | |
| 9,603,271 | B2 * | 3/2017 | Lee | H05K 5/0017 |
| 9,606,583 | B2 * | 3/2017 | Ahn | G06F 1/1641 |
| 9,869,114 | B1 * | 1/2018 | Hung | E05D 3/18 |
| 9,870,031 | B2 * | 1/2018 | Hsu | G06F 1/1681 |
| 9,898,051 | B2 * | 2/2018 | Cho | G06F 1/1616 |
| 9,915,981 | B2 * | 3/2018 | Hsu | G06F 1/1681 |
| 9,921,611 | B2 * | 3/2018 | Wang | G06F 1/1681 |
| 9,930,794 | B2 * | 3/2018 | Luan | H05K 5/0217 |
| 9,946,310 | B1 * | 4/2018 | Huang | G06F 1/1681 |
| 10,021,795 | B2 * | 7/2018 | Hsu | H04M 1/0268 |
| 10,129,991 | B2 * | 11/2018 | Lin | G06F 1/1681 |
| 10,143,098 | B1 * | 11/2018 | Lee | E05D 11/06 |
| 10,287,808 | B2 * | 5/2019 | Zhang | H05K 5/0226 |
| RE47,619 | E * | 9/2019 | Kauhaniemi | G06F 1/1681 |
| 2009/0183342 | A1 * | 7/2009 | Chang | H04N 5/64 16/366 |
| 2012/0044620 | A1 * | 2/2012 | Song | G06F 1/1616 361/679.01 |
| 2012/0120618 | A1 * | 5/2012 | Bohn | G06F 1/1618 361/749 |
| 2014/0123436 | A1 * | 5/2014 | Griffin | H04M 1/0216 16/221 |
| 2014/0196254 | A1 * | 7/2014 | Song | E05D 3/14 16/302 |
| 2015/0277505 | A1 * | 10/2015 | Lim | G06F 1/1681 361/679.27 |
| 2016/0139634 | A1 * | 5/2016 | Cho | G06F 1/1652 361/679.27 |
| 2016/0147267 | A1 * | 5/2016 | Campbell | E05D 3/06 361/679.27 |
| 2016/0202736 | A1 * | 7/2016 | Huang | G06F 1/1681 16/369 |
| 2016/0205792 | A1 * | 7/2016 | Ahn | H05K 5/0017 40/779 |
| 2017/0094775 | A1 * | 3/2017 | Fan | G06F 1/1652 |
| 2018/0136696 | A1 * | 5/2018 | Chen | H04M 1/0216 |
| 2018/0192528 | A1 * | 7/2018 | Lin | G06F 1/1681 |
| 2018/0239401 | A1 * | 8/2018 | Lin | F16M 11/10 |
| 2018/0341295 | A1 * | 11/2018 | Lan | G06F 1/1681 |
| 2019/0345748 | A1 * | 11/2019 | Liao | G06F 1/1681 |

* cited by examiner

HINGE ASSEMBLY AND ELECTRONIC DEVICE USING THE SAME

CROSS-REFERENCE TO RELATED APPLICATION

This application claims the priority benefit of TW application serial No. 106113828, filed on Apr. 25, 2017. The entirety of the above-mentioned patent application is hereby incorporated by references herein and made a part of specification.

BACKGROUND OF THE INVENTION

Field of the Invention

The disclosure relates to a hinge and an electronic device using the same.

Description of the Related Art

Electronic devices are widely used. However, a conventional hinge assembly of an electronic device includes a specific configuration for structural strength. Therefore, the rotational freedom of the conventional hinge assembly is limited. The operation way of the electronic device is also limited.

BRIEF SUMMARY OF THE INVENTION

According to an aspect of the disclosure, a hinge assembly is provided. The hinge assembly comprises a rotating shaft structure, a first movable assembly, and a second movable assembly. The rotating shaft structure includes a first rotating part and a second rotating part, and the first rotating part coaxially rotates relative to the second rotating part. The first movable assembly includes a first connecting member and a first moving member movably connected to the first connecting member. The first movable assembly is connected to the first rotating part to rotate with the first rotating part simultaneously. The second movable assembly includes a second connecting member and a second moving member movably connected to the second connecting member. The second movable assembly is connected to the second rotating part to rotate with the second rotating part simultaneously.

According to an aspect of the disclosure, an electronic device is provided. The electronic device comprises a hinge assembly, a first casing, a second casing, and a flexible device. The hinge assembly includes a rotating shaft structure, a first movable assembly, and a second movable assembly.

The rotating shaft structure includes a first rotating part and a second rotating part. The first rotating part coaxially rotates relative to the second rotating part. The first movable assembly includes a first connecting member and a first moving member movably connected to the first connecting member.

The first movable assembly is connected to the first rotating part to rotate with the first rotating part simultaneously. The second movable assembly includes a second connecting member and a second moving member movably connected to the second connecting member. The second movable assembly is connected to the second rotating part to rotate with the second rotating part simultaneously.

The first casing is connected to the first movable assembly. The second casing is connected to the second movable assembly. The flexible device is partly configured at the first casing and at the second casing. The flexible device is flattened or bent when the first casing and the second casing open or close.

According to an aspect of the disclosure, a hinge assembly is provided. The hinge assembly comprises a movable assembly, a first rotating shaft structure, and a second rotating shaft structure. The movable assembly includes a connecting member and a moving member movably connected to the connecting member.

The first rotating shaft structure includes a first rotating part and a second rotating part, and the first rotating part coaxially rotates relative to the second rotating part. The first rotating part is connected to the moving member to rotate with the moving member simultaneously. The second rotating part is configured to connect a first connection member.

The second rotating shaft structure includes a third rotating part and a fourth rotating part, and the third rotating part coaxially rotates relative to the fourth rotating part. The third rotating part is configured to connect a second connection member. The fourth rotating part is connected to the connecting member to rotate with the connecting member simultaneously.

According to an aspect of the disclosure, an electronic device is provided. The electronic device comprises a hinge assembly, a first casing, a second casing, and a flexible device. The hinge assembly includes a movable assembly, a first rotating shaft structure, and a second rotating shaft structure.

The movable assembly includes a connecting member and a moving member movably connected to the connecting member.

The first rotating shaft structure includes a first rotating part and a second rotating part, and the first rotating part coaxially rotates relative to the second rotating part. The first rotating part is connected to the moving member to rotate with the moving member simultaneously.

The second rotating part is configured to connect a first connection member. The second rotating shaft structure includes a third rotating part and a fourth rotating part, and the third rotating part coaxially rotates relative to the fourth rotating part. The third rotating part is configured to connect a second connection member. The fourth rotating part is connected to the connecting member to rotate with the connecting member simultaneously.

The first casing is connected to the first connection member. The second casing is connected to the second connection member. The flexible device partly is configured at the first casing and at the second casing. The flexible device is flattened or bent when the first casing and the second casing open or close.

In the embodiments, the first rotating shaft structure and the second rotating shaft structure of the hinge assembly rotate and bend with the flexible device. When the flexible device bends towards the inner side, the moving members of each movable assembly move close to each other. When the flexible device bends towards the outer side, the moving members of each movable assembly move far away from each other.

Then, the flexible device bends according to requirements. The hinge assembly is connected to the electronic device to stretch or compress adaptively in the bidirectional bending of the flexible device. The hinge assembly allows the flexible device to bend greatly and meets the requirement of bidirectionally bending.

DETAILED DESCRIPTION OF THE EMBODIMENTS

These and other features, aspects, and advantages of the present invention will become better understood with regard to the following description, appended claims, and accompanying drawings. However, the invention is not limited to the embodiments.

Figure 1:
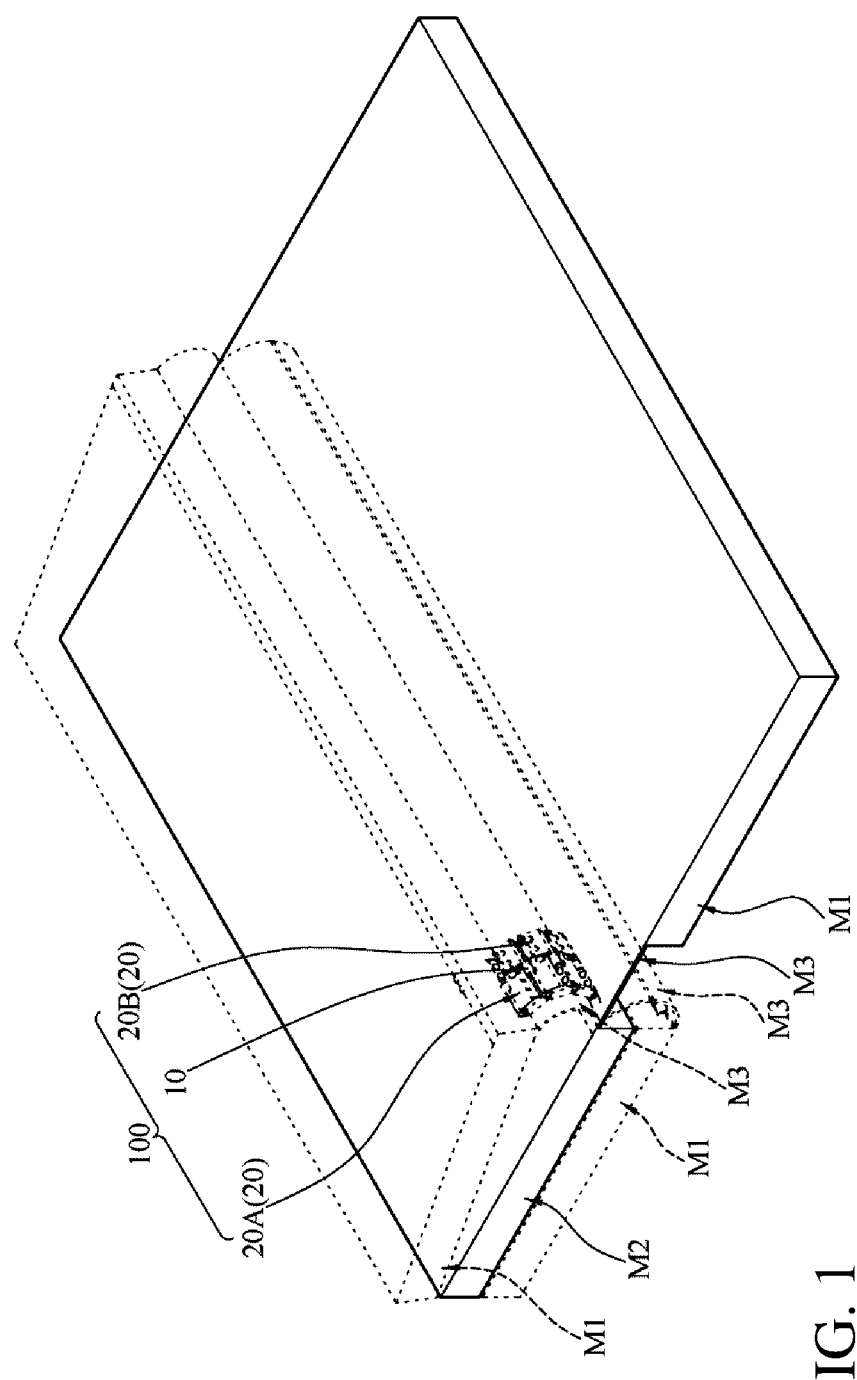
FIG. 1 is a schematic view showing usage states of an electronic device according to an embodiment.

Please refer to FIG. 1. FIG. 1 is a schematic view showing usage states of an electronic device according to an embodiment. The electronic device is a display panel, a speaker, a multimedia device or an input/output device, which is not limited herein. The electronic device shown in FIG. 1 includes a hinge assembly 100, a first casing M1, a second casing M2 and a flexible device M3. The hinge assembly 100 is configured between the first casing M1 and the second casing M2.

Then, the first casing M1 and the second casing M2 open and close via the hinge assembly 100. Parts of the flexible device M3 are configured on the first casing M1 and the second casing M2, respectively. Then, the flexible device M3 are flattened or bent according different states of the first casing M1 and the second casing M2.

In the embodiment, one side where the first casing M1, the second casing M2 and the hinge assembly 100 are disposed is defined as an inner side, and the other side is defined as an outer side.

Figure 2:
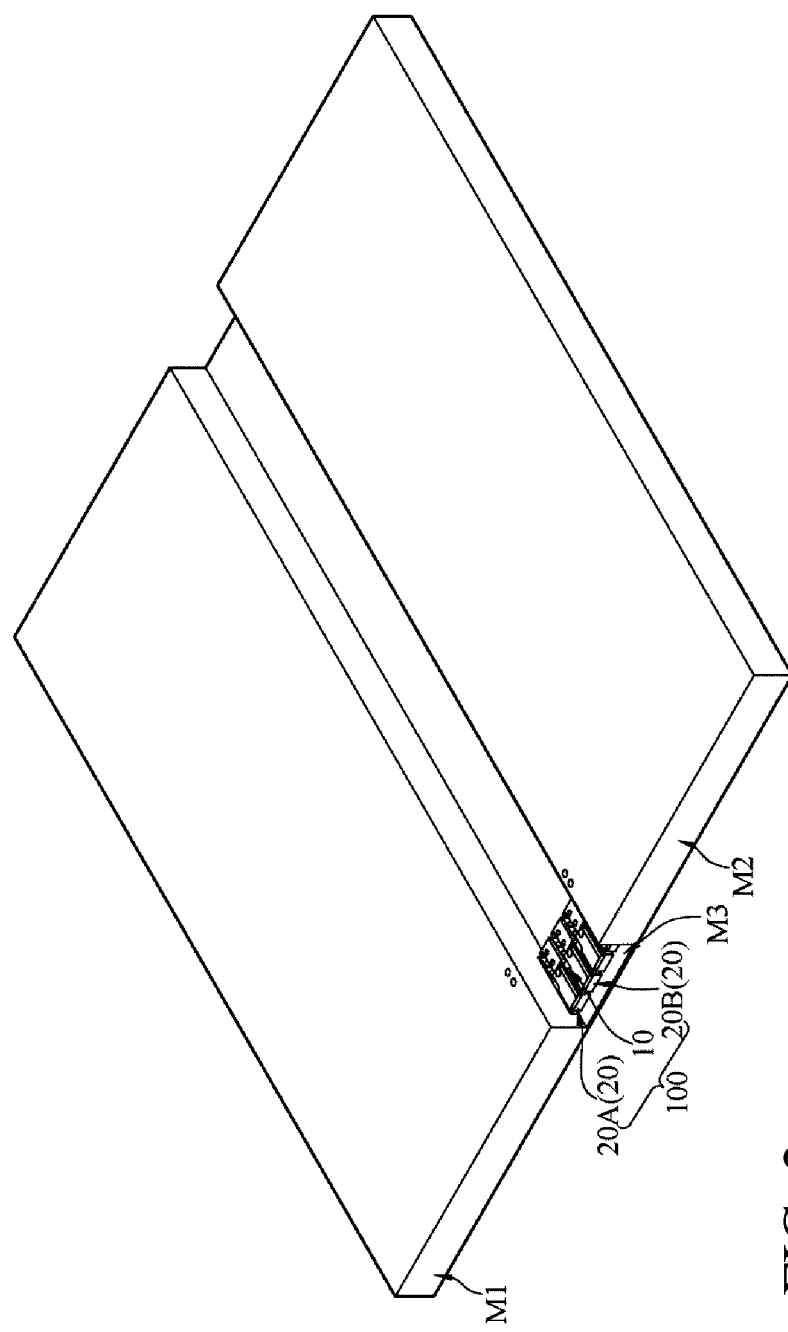
FIG. 2 is a schematic view showing a flat state of an electronic device according to an embodiment.

Please refer to FIG. 2. In one embodiment, the hinge assembly 100 includes a rotating shaft structure 10 and a movable assembly 20. The movable assembly 20 moves linearly. The rotating shaft structure 10 is configured between each two movable assemblies 20 connected with each other in series. The two movable assemblies 20 rotate relative to each other. The movable assembly 20 moves linearly when rotating. Therefore, when two ends of the hinge assembly 100 moves close to each other to bend, the angle and the position of the movable assembly 20 change via the rotating shaft structure 10. As a result, the movement of the movable assembly 20 makes the length of the hinge assembly 100 change during the bending of the hinge assembly 100. Thus, the hinge assembly 100 can bend bidirectionally.

Figure 3:
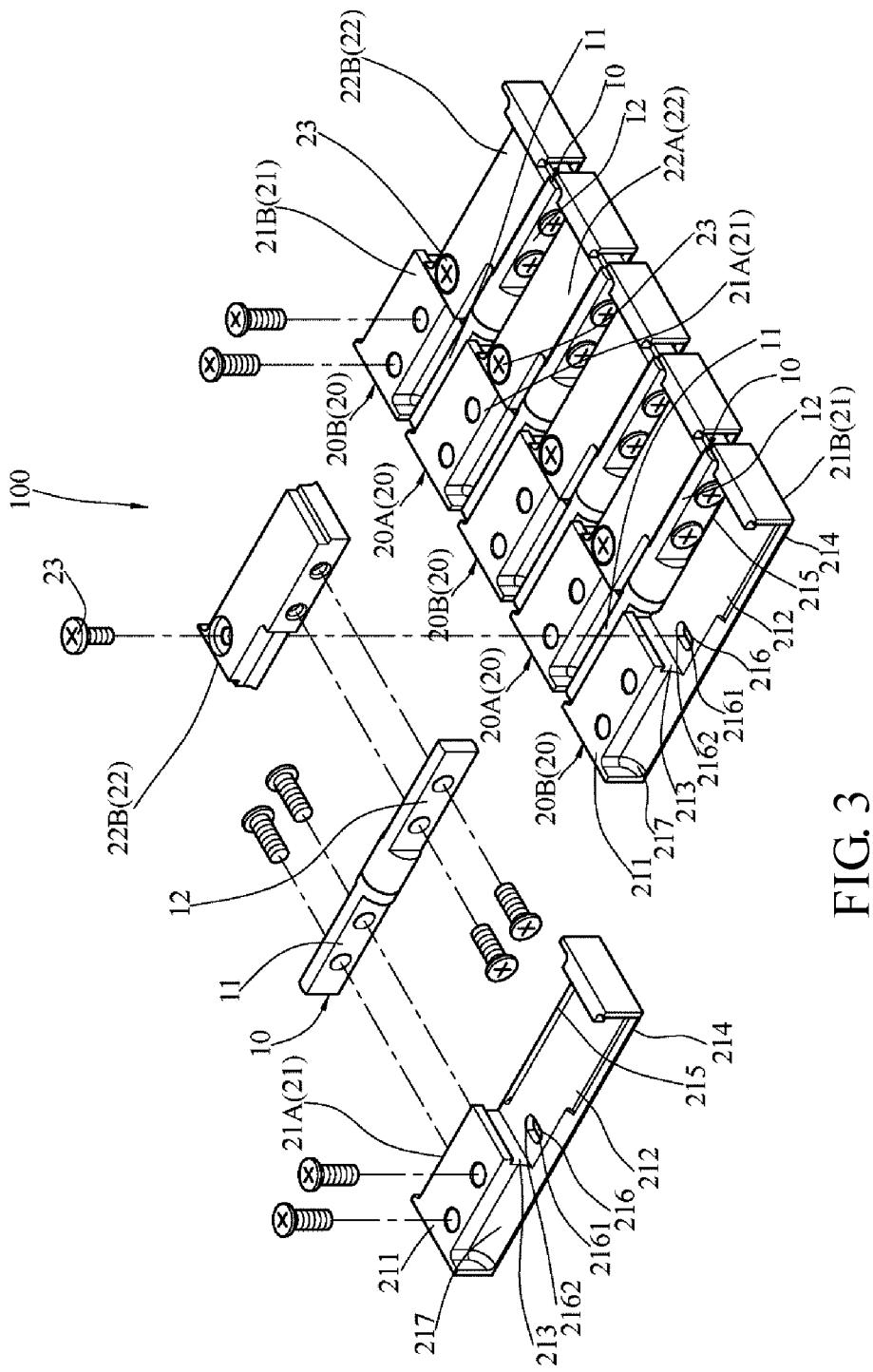
FIG. 3 is an exploded view showing a hinge assembly of an electronic device according to an embodiment.

Please refer to FIG. 3. In an embodiment, the rotating shaft structure 10 includes a first rotating part 11 and a second rotating part 12. The first rotating part 11 coaxially rotates relative to the second rotating part 12. In the embodiment, the movable assembly 20 includes a first movable assembly 20A and a second movable assembly 20B. The first movable assembly 20A and the second movable assembly 20B are configured alternatively and are connected via the rotating shaft structure 10.

In an embodiment, the first movable assembly 20A is connected to the first rotating part 11 to rotate with the first rotating part 11 synchronously. The second movable assembly 20B is connected to the second rotating part 12 to rotate with the second rotating part 12 synchronously. Therefore, the first movable assembly 20A and the second movable assembly 20B connected to the same rotating shaft structure 10 rotate coaxially relative to each other.

Please refer to FIG. 3. Each movable assembly 20 includes a connecting member 21 and a moving member 22. The moving member 22 is linearly moveably connected to the connecting member 21. The movable assembly 20 is connected to the rotating shaft structure 10 via the moving member 22 or the connecting member 21.

Please refer to FIG. 3. In an embodiment, the first movable assembly 20A includes a first connecting member 21A and a first moving member 22A. The first moving member 22As is linearly moveably connected to the first connecting member 21A. The second movable assembly 20B includes a second connecting member 21B and a second moving member 22B. The second moving member 22B is linearly moveably connected to the second connecting member 21B.

Please refer to FIG. 3. In an embodiment, the orientations of the first movable assembly 20A and the second movable assembly 20B connected to the rotating shaft structure 10 are the same. The first movable assembly 20A is connected to the first rotating part 11 via the first connecting member 21A. The second movable assembly 20B is connected to the second rotating part 12 via the second moving member 22B. The same orientation of the embodiment means that the same part of each movable assembly 20 orients towards the same direction, such as the configuration of each movable assembly 20 in FIG. 3.

Please refer to FIG. 3. Each connecting member 21 includes a first segment 211 and a second segment 212. A step 213 is formed between the first segment 211 and the second segment 212. The position of the second segment 212 is lower than the position of the first segment 211.

The connecting member 21 includes a first side 214 and second side 215 opposite to each other. A slot hole 216 is configured on the second segment 212. The slot hole 216 includes a first end 2161 and a second end 2162. The connection direction from the first end 2161 to the second end 2162 is perpendicular to an extending direction of the first side 214 and the second side 215.

The moving member 22 is slidably configured on the second segment 212. In the embodiment, a pin 23 is connected to the moving member 22. The pin 23 passes through one end of the moving member 22 to locate within the slot hole 216. Then, the moving member 22 moves linearly along the extending direction of the slot hole 216 via the pin 23.

Please refer to FIG. 3. In an embodiment, the first connecting member 21A of the first movable assembly 20A is connected to the first rotating part 11 via the second side 215 of the first segment 211. The second moving member 22B of the second movable assembly 20B is connected to the second rotating part 12 via the first side 214 of the second connecting member 21B.

Therefore, the first rotating part 11 of the rotating shaft structure 10 rotates with the first connecting member 21A synchronously. Furthermore, the second rotating part 12 with the same rotating shaft as the first rotating part 11 rotates to drive the second moving member 22B to move. When the first casing M1 and the second casing M2 are opened and closed, the first rotating part 11 and the second rotating part 12 rotate, and the moving member 22 moves linearly. Then, the length of the inner and outer rings of the hinge assembly 100 changes to make the first casing M1 and the second casing M2 open and close.

Figure 4:
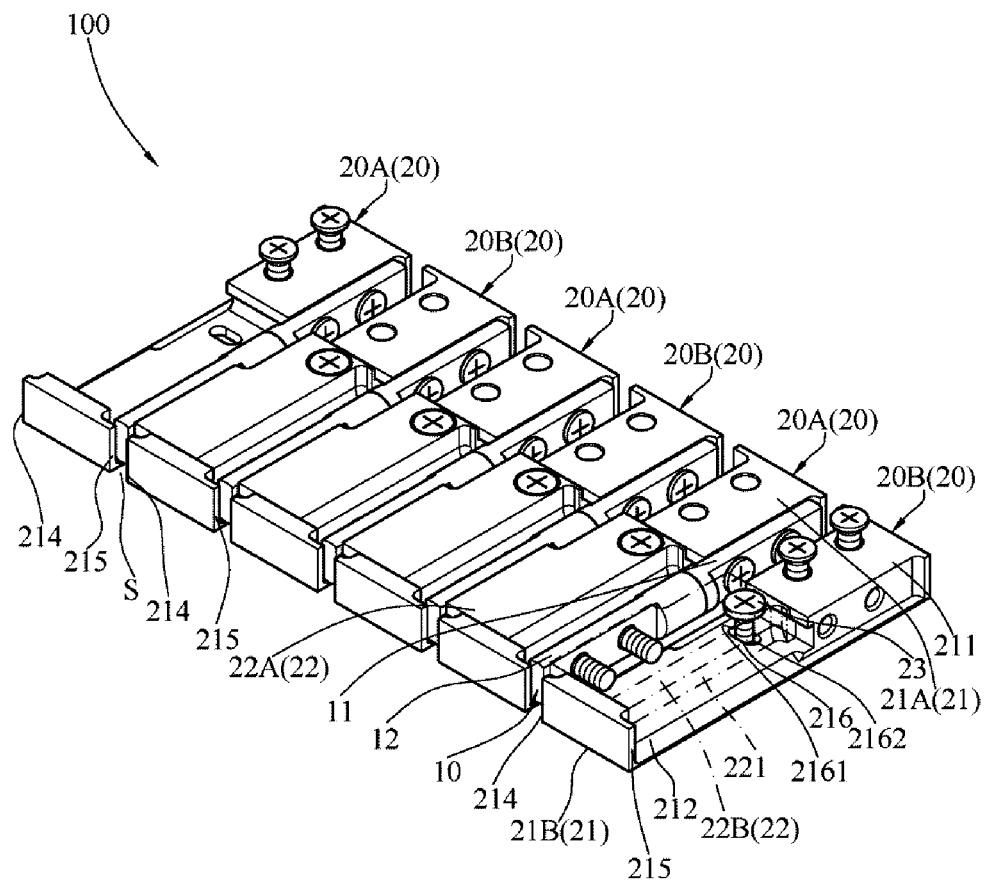
FIG. 4 is a schematic view showing a hinge assembly in FIG. 3 after assembled.

Please refer to FIG. 2 and FIG. 4. FIG. 4 is a schematic view showing a hinge assembly in FIG. 3 after assembled. In FIG. 4, the first casing M1 opens relative to the second casing M2, and the flexible device M3 is flattened. The pin 23 is accommodated in the slot hole 216. A gap S is formed between the second side 215 of the first movable assembly 20A and the first side 214 of the second movable assembly 20B. Therefore, the moving distance of each moving member 22 is equal to the length of the slot hole 216.

Please refer to FIG. 3 and FIG. 4. A first arc guiding portion 217 is formed at the first side 214 of the first segment 211 of each connecting member 21. Each moving member 22 includes a second arc guiding portion 221. The second arc guiding portion 221 is configured at the side opposite to the side of each moving member 22 connected to the second rotating part 12. As a result, when the first rotating part 11 of the rotating shaft structure 10 rotates, the first rotating part 11 rotates with the guide of the first arc guiding portion 217, and the second rotating part 12 rotates with the guide of the second arc guiding portion 221.

Figure 5:
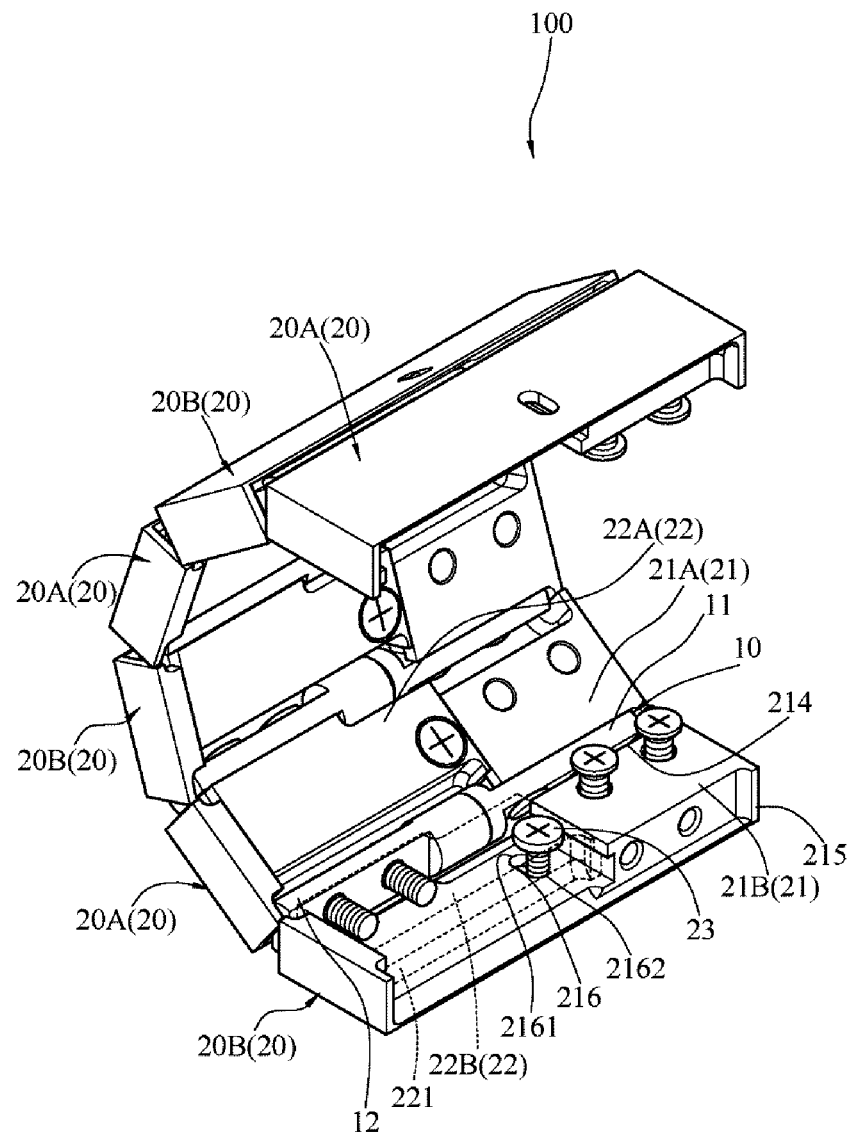
FIG. 5 is a schematic view showing a usage state of a hinge assembly in FIG. 3 bending towards a side.
Figure 6:
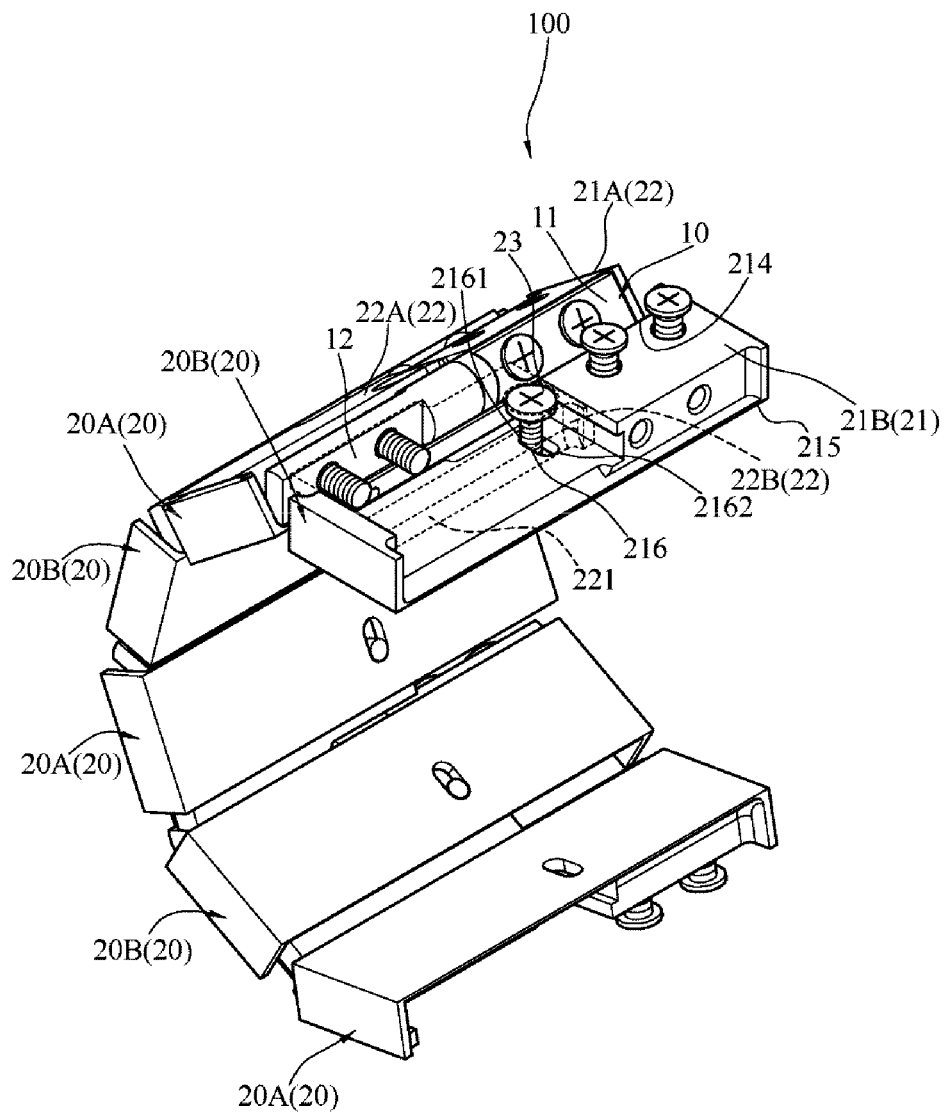
FIG. 6 is a schematic view showing a usage state of a hinge assembly in FIG. 3 bending towards another side.

Please refer to FIG. 5 and FIG. 6. In FIG. 5 and FIG. 6, the hinge assembly 100 bends towards different directions. Please refer to FIG. 2 and FIG. 5. In FIG. 5, the first movable assembly 20A of the hinge assembly 100 connected with the first rotating part 11 is connected to the first casing M1, and the second movable assembly 20B of the second rotating part 12 is connected to the second casing M2.

Please also refer to FIG. 1. When the flexible device M3 bends towards the inner side, the inner side of the flexible device M3 is compressed to drive the hinge assembly 100 to bend. The first rotating part 11 and the second rotating part 12 of the rotating shaft structure 10 of the hinge assembly 100 rotate. Then, the hinge assembly 100 bends along the bending direction of the flexible device M3.

The hinge assembly 100 is forced by compressing the flexible device M3 towards the inner side. Then, the moving member 22 is stressed due to the force to the hinge assembly 100. Thus, the pin 23 moves in the slot hole 216 towards the direction of the second end 2162. As a result, the pin 23 drives the moving member 22, and the moving member 22 drives the rotating shaft structure 10 connected with the moving member 22 to move towards the first side 214. Then, adjacent movable assemblies 20 move close to each other. The flexible device M3 is compressed inwardly. The flexible device M3 bends towards the inner side.

Please refer to FIG. 6 and FIG. 1. When the flexible device M3 bends towards the outer side, the outer side of the flexible device M3 is stretched to make the hinge assembly 100 bend. When the first rotating part 11 and the second rotating part 12 of the rotating shaft structure 10 rotate, the hinge assembly 100 bends along the bending direction of the flexible device M3.

Since the flexible device M3 is stretched towards the outer side, the hinge assembly 100 is also stretched. The moving member 22 is stressed due to the force from the hinge assembly 100. Then, the pin 23 moves towards the direction of the first end 2161 in the slot hole 216. The pin 23 drives the moving member 22 to make the rotating shaft structure 10 move away from the first side 214. As a result, the adjacent movable assemblies 20 move away from each other, and it makes the flexible device M3 bend towards the outer side.

Figure 7:
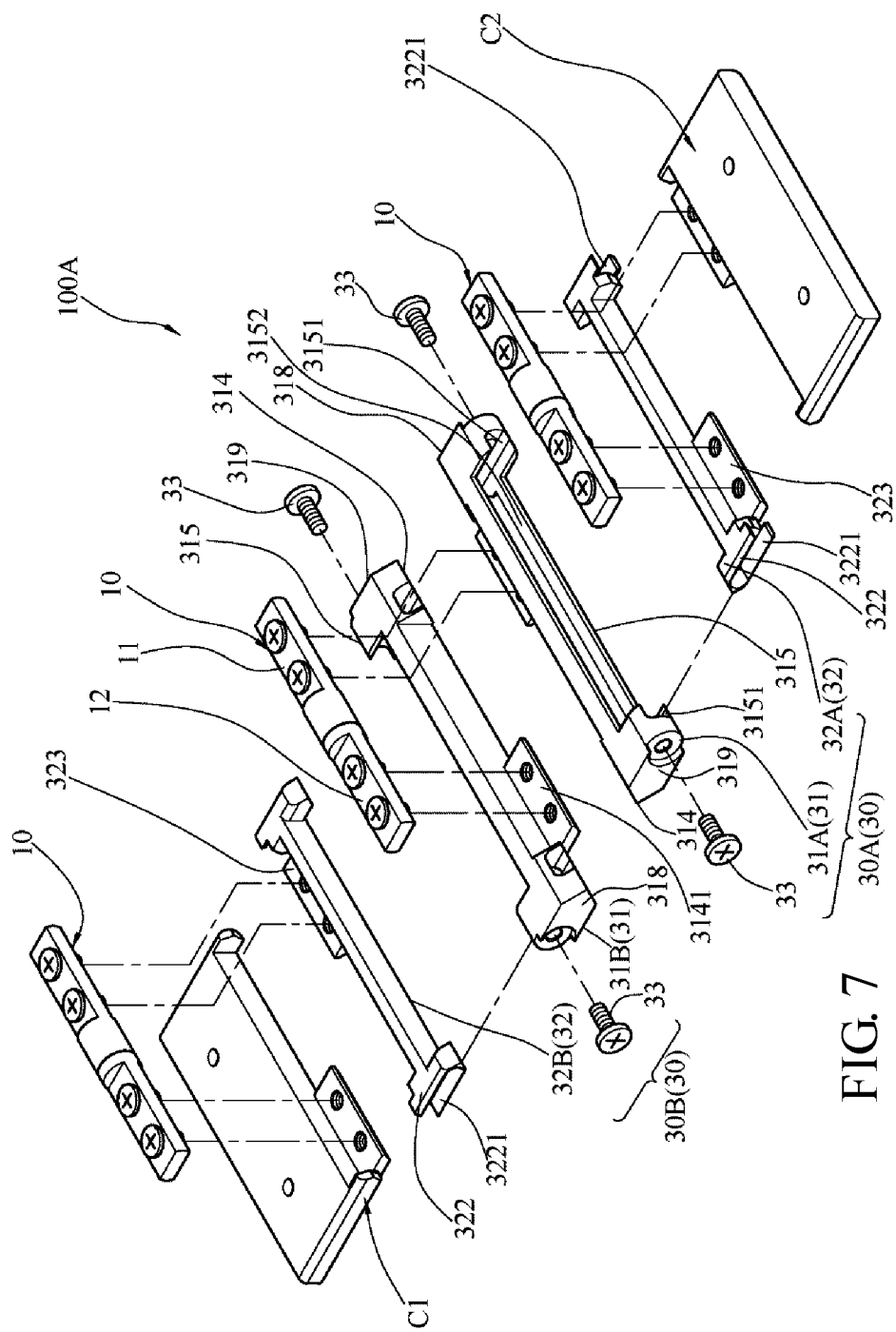
FIG. 7 is an exploded view showing a hinge assembly of an electronic device according to an embodiment.

Please refer to FIG. 7. FIG. 7 is an exploded view showing a hinge assembly 100A of an electronic device according to an embodiment. Similar to the above embodiment, the first movable assembly 30A of the hinge assembly 100A is connected to the first rotating part 11 and rotates with the first rotating part 11 simultaneously. The second movable assembly 30B is connected to the second rotating part 12 and rotates with the second rotating part 12 simultaneously.

The orientations of the first movable assembly 30A and the second movable assembly 30B connected to the same rotating shaft structure 10 are different. In an embodiment, when multiple hinge assemblies 100A are connected with each other in series, the first movable assembly 30A and the second movable assembly 30B connected to the same rotating shaft structure 10 are connected to the rotating shaft structure 10 via the connecting member 31 or the moving member 32.

Please refer to FIG. 7. Each movable assembly 30 in FIG. 7 also includes a connecting member 31 and a moving member 32. The connecting member 31 includes a first side 314, a second side 315, a third side 318 and a fourth side 319. The third side 318 and the fourth side 319 locate at two ends of the first side 314 and second side 315, respectively. In the embodiment, two guiding slots 3151 and a connecting slot 3152 are formed at the second side 315 of the connecting member 31. The two guiding slots 3151 are opposite to each other and locate at two ends of the connecting slot 3152. The extending direction of the connecting slot 3152 is perpendicular to the extending direction of the two guiding slots 3151.

The first movable assembly 30A and the second movable assembly 30B which are connected to a same rotating shaft structure 10 is connected to the rotating shaft structure 10 via the connecting member 31. The first moving member 32A of the first movable assembly 30A is connected to another rotating shaft structure 10. The second moving member 32B of the second movable assembly 30B is connected to another rotating shaft structure 10.

The first movable assembly 30A is connected to the first rotating part 11 of the rotating shaft structure 10 via the first side 314 of the first connecting member 31A. The second movable assembly 30B is connected to the second rotating part 12 of the rotating shaft structure 10 via the first side 14 of the second connecting member 31B.

The third side 318 of the first connecting member 31A is opposite to the fourth side 319 of the second connecting member 31B. Therefore, the orientation of the first movable assembly 30A and that of the second movable assembly 30B are different. In an embodiment, a connecting plate 3141 is configured at the first side 314 of each connecting member 31. The connecting member 31 is connected against the first rotating part 11 or the second rotating part 12 of the rotating shaft structure 10 via the connecting plate 3141.

Please refer to FIG. 7. Each moving member 32 includes two guided parts 322. The two guided parts 322 are configured at two ends of the moving member 32. Each guided part 322 includes a sliding slot 3221. The extending direction of the sliding slot 3221 is perpendicular to that of the connecting slot 3152 of the moving member 32.

Each guided part 322 of the moving member 32 is slidably configured in each guiding slot 3151. Consequently, the moving member 32 linearly moves along the extending direction of the guiding slot 3151 on the connecting member 31. In an embodiment, the moving member 32 further includes a connecting plate 323. The moving member 32 is connected against the first rotating part 11 or the second rotating part 12 of the rotating shaft structure 10 via the connecting plate 323.

In the embodiment, each movable assembly 30 includes two pins 33. The two pins 33 pass through the connecting member 31 along the extending direction of the connecting slot 3152 and are connected to the connecting member 31. The pins 33 pass through one end of the connecting member 31 and get into the sliding slot 3221 via the guiding slot 3151.

Figure 8:
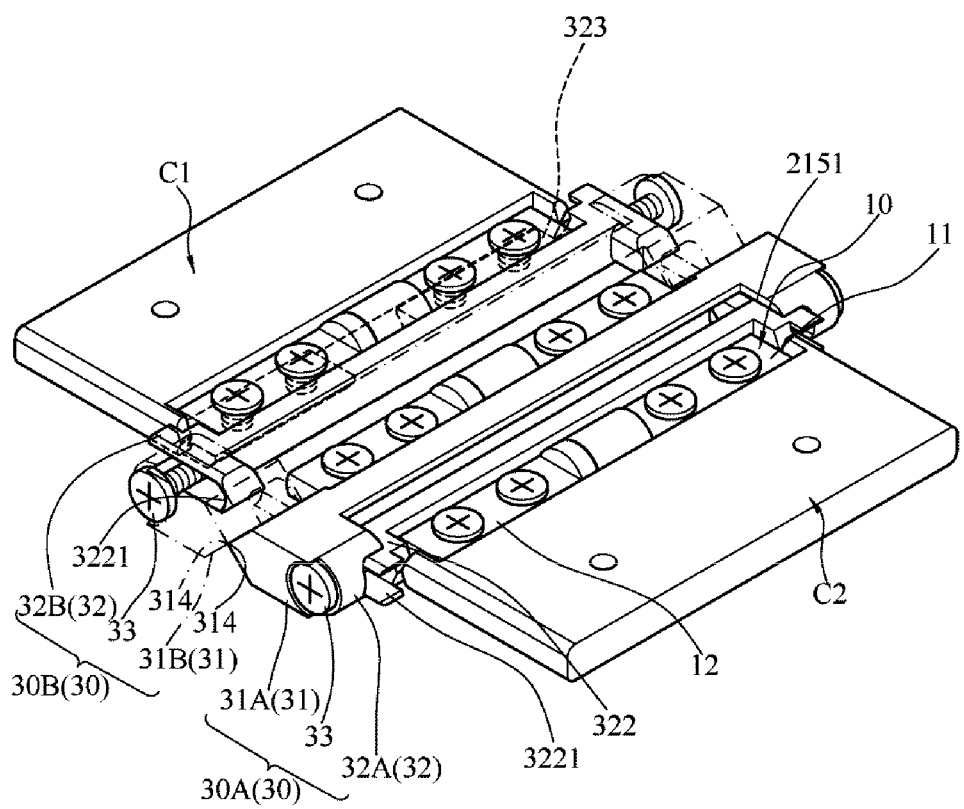
FIG. 8 is a schematic view showing a hinge assembly in FIG. 7 after assembled.

Please refer to FIG. 8. FIG. 8 is a schematic view showing a hinge assembly in FIG. 7 after assembled. In FIG. 8, in order to facilitate connecting the hinge assembly 100A to other components, the hinge assembly 100A further includes a first connection member C1 and a second connection member C2. The first connection member C1 is connected to the first casing M1. The second connection member C2 is connected to the second casing M2.

The first connection member C1 and the second connection member C2 are configured at two ends of the hinge assembly 100A, respectively. The first connection member C1 and the second connection member C2 are connected to different rotating shaft structures 10. The first connection member C1 is connected to the second rotating part 12 of the rotating shaft structure 10, and the second connection member C2 is connected to the first rotating part 11 of the rotating shaft structure 10.

In FIG. 8, the first connection member C1 and the second connection member C2 are flattened. The pins 33 locate between the bottom of the slot and the top of the sliding slot 3221, respectively. Therefore, the moving members 32 of two movable assemblies 30 connected to the same rotating shaft structure 10 are movable between the bottom of the slot or the top along the sliding slot 3221, respectively.

Figure 9:
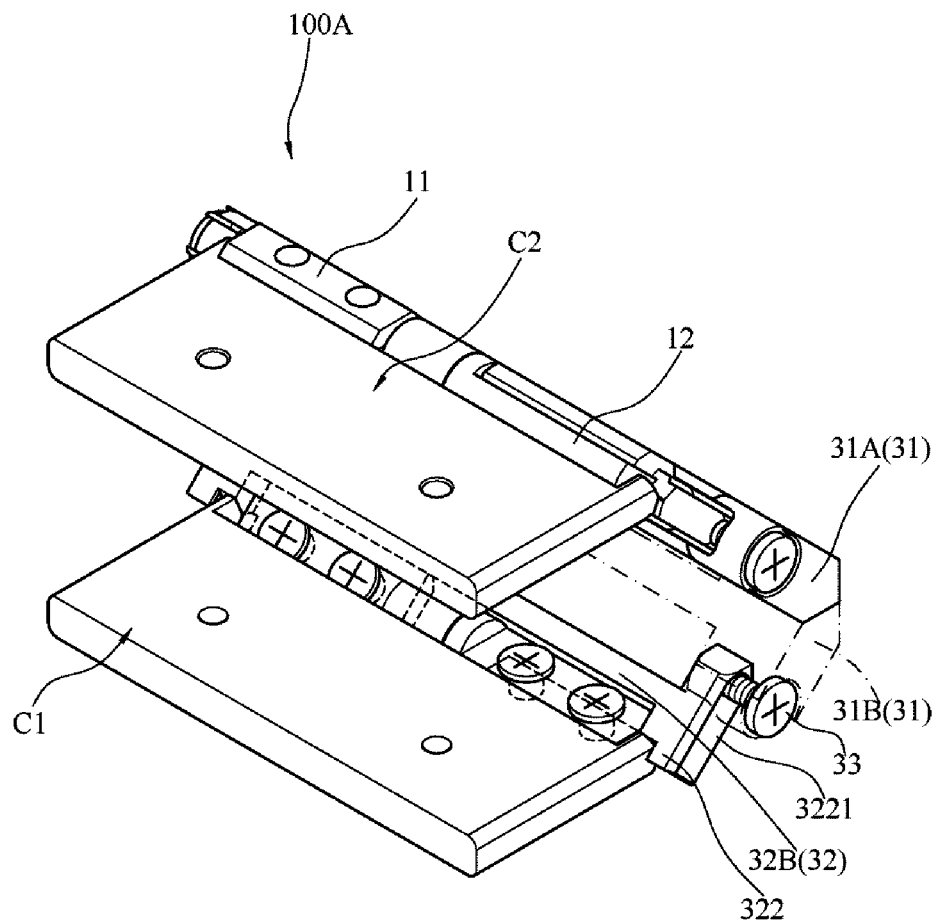
FIG. 9 is a schematic view showing a usage state of a hinge assembly in FIG. 7 bending towards a side.
Figure 10:
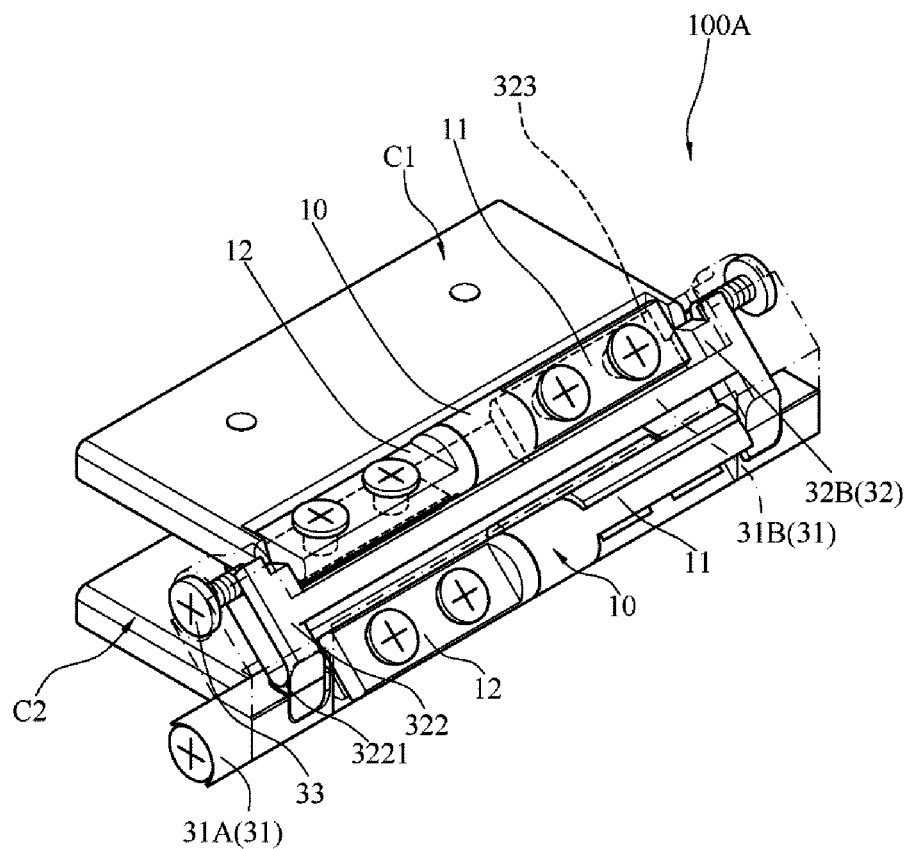
FIG. 10 is a schematic view showing a usage state of a hinge assembly in FIG. 7 bending towards another side.

FIG. 9 and FIG. 10 are schematic views showing a hinge assembly in FIG. 7 bending towards different directions. Please refer to FIG. 9. In FIG. 9, the first connection member C1 of the hinge assembly 100A keeps at a fixed location while the second connection member C2 rotates anticlockwise. When the second connection member C2 rotates anticlockwise, the second connection member C2 drives the first rotating part 11 and the second rotating part 12 of the hinge assembly 100A to rotate correspondingly.

At the same time, since a position difference is formed between the inner circle and the outer circle when the whole hinge assembly 100A rotates, each moving member 32 moves linearly via the configuration of the sliding slot 3221 and the pins 33. Furthermore, each moving member 32 moves to the position where the pin 33 locates at the bottom of the sliding slot 3221. Then, the hinge assembly 100A rotates successfully.

Please refer to FIG. 10. In FIG. 10, the first connection member C1 of the hinge assembly 100A keeps at a fixed location while the second connection member C2 rotates clockwise. When the second connection member C2 rotates clockwise, the second connection member C2 drives the first rotating part 11 and the second rotating part 12 of the hinge assembly 100A to rotate.

Figure 11:
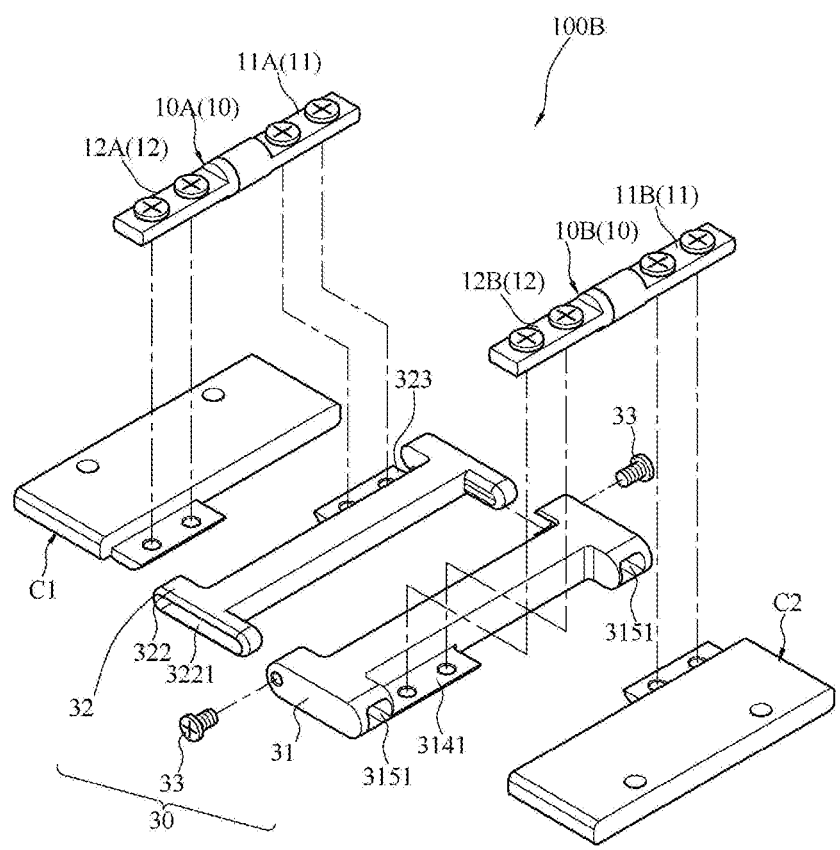
FIG. 11 is an exploded view showing a hinge assembly of an electronic device according to an embodiment.

At the same time, since a position difference is formed between the inner circle and the outer circle when the whole hinge assembly 100A rotates, each moving member 32 moves to the position where the pin 33 locates at the bottom of the sliding slot 3221. Then, the hinge assembly 100A rotates successfully Please refer to FIG. 11. FIG. 11 is an exploded view showing a hinge assembly of an electronic device according to an embodiment. The hinge assembly 100B includes a rotating shaft structure 10 and a movable assembly 30. The difference between the hinge assembly 100B and the hinge assembly 100A is that the orientations of the movable assemblies 30 of the hinge assembly 100B are the same. In the embodiment, a movable assembly 30 is configured between each two rotating shaft structures 10 of the hinge assembly 100B. Then, the hinge assembly 100B bends bidirectionally.

Please refer to FIG. 11. In an embodiment, the rotating shaft structure 10 includes a first rotating shaft structure 10A and a second rotating shaft structure 10B. The first rotating shaft structure 10A and the second rotating shaft structure 10B are configured alternatively. The movable assembly 30 is connected between the first rotating shaft structure 10A and the second rotating shaft structure 10B.

Please refer to FIG. 11. The first rotating shaft structure 10A includes a first rotating part 11A and a second rotating part 12A. The first rotating part 11A can coaxially rotate relative to the second rotating part 12A. The first rotating part 11A is connected to the connection plate 323 of the moving member 32. The second rotating part 12A is configured to connect the first connection member C1. The first connection member C1 is configured to connect the first casing M1.

Please refer to FIG. 11. The second rotating shaft structure 10B includes a third rotating part 11B and a fourth rotating part 12B. The third rotating part 11B coaxially rotates relative to the fourth rotating part 12B. The third rotating part 11B is configured to connect the second connection member C2. The second connection member C2 is configured to connect the second casing M2. The fourth rotating part 12B is connected to the connecting plate 3141 of the connecting member 31.

Figure 12:
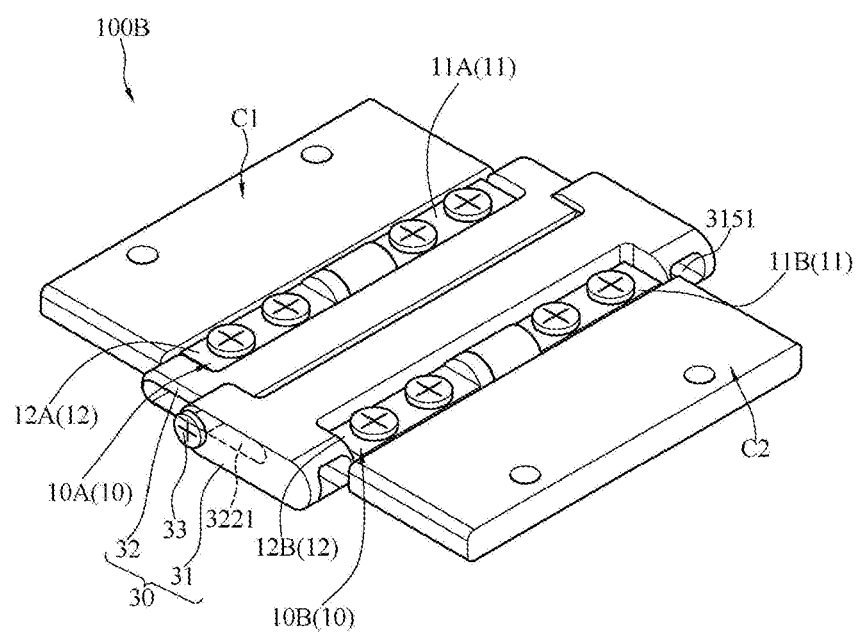
FIG. 12 is a schematic view showing a hinge assembly in FIG. 11 after assembled.

Please refer to FIG. 12. FIG. 12 is a schematic view showing a hinge assembly in FIG. 11 after assembled. In FIG. 12, the hinge assembly 100B is flattened. When the hinge assembly 100B is flattened, the pins 33 locate at a position between two ends of the sliding slot 3221. Therefore, the moving member 32 of the movable assembly 30 moves between the two ends of the sliding slot 3321.

Figure 13:
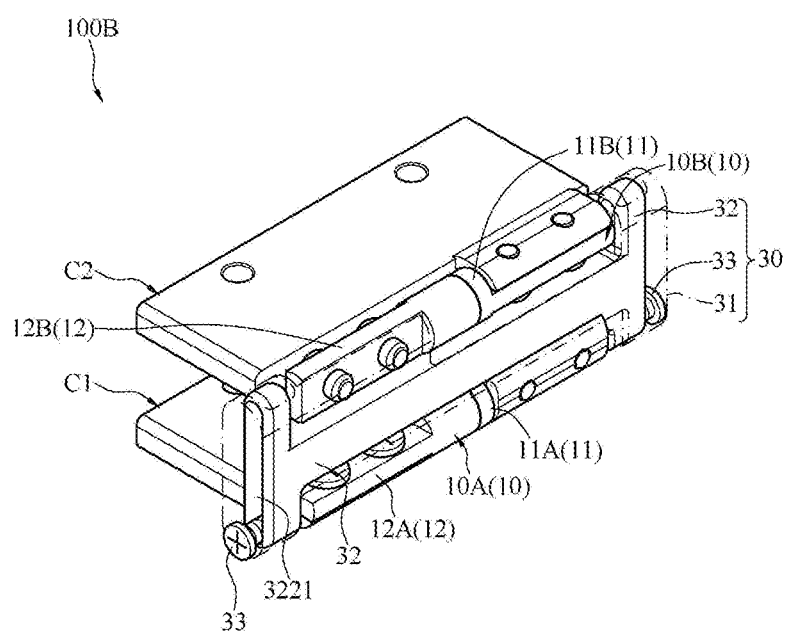
FIG. 13 is a schematic view showing a usage state of a hinge assembly in FIG. 11 bending towards a side.
Figure 14:
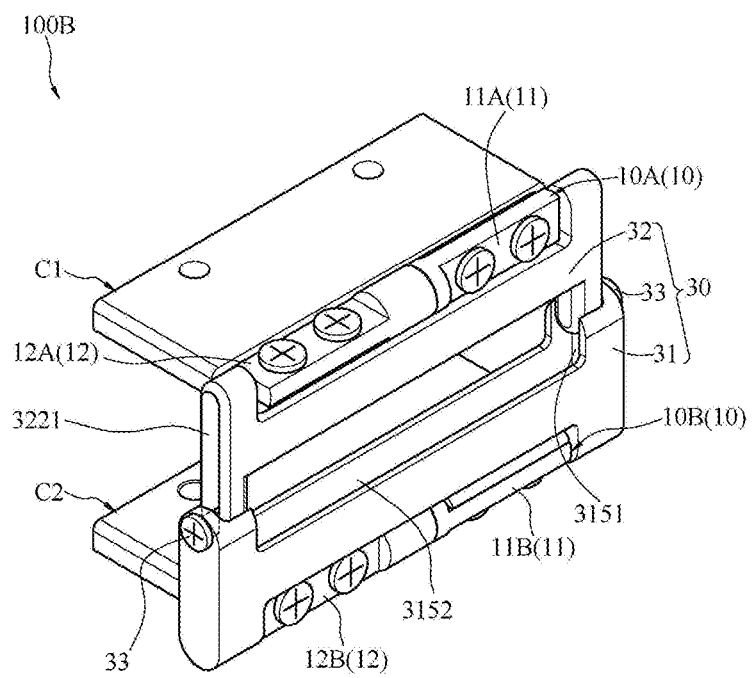
FIG. 14 is a schematic view showing a usage state of a hinge assembly in FIG. 11 bending towards another side.

Please refer to FIG. 13 and FIG. 14. FIG. 13 and FIG. 14 are schematic views showing a hinge assembly in FIG. 11 bending towards different directions. In FIG. 13, the first connection member C1 of the hinge assembly 100B keeps at a fixed location, while the second connection member C2 rotates anticlockwise. When the second connection member C2 rotates anticlockwise, the second connection member C2 drives the connecting member 31 of the hinge assembly 100B to rotate, and the connecting member 31 drives the first rotating part 11A of the first rotating shaft structure 10A to rotate.

At the time, the connecting member 31 rotates to be perpendicular to the first connection member C1. Then, the second connection member C2 continues to move, the third rotating part 11B of the second rotating shaft structure 10B also rotates to make the second connection member C2 parallel with the first connection member C1.

At the same time, since and a position difference is formed between the inner circle and the outer circle when the whole hinge assembly 100B rotates, the moving member 32 moves linearly via the configuration of the sliding slot 3221 and the pins 33. Furthermore, each moving member 32 moves to the position where the pin 33 locates at a side of the sliding slot 3221 near the first connection member C1. Then, the hinge assembly 100B rotates successfully.

Please refer to FIG. 14. In FIG. 14, the first connection member C1 of the hinge assembly 100B keeps at a fixed location, and the second connection member C2 rotates clockwise. When the second connection member C2 rotates clockwise, the second connection member C2 drives the moving member 32 to rotate, and the moving member 32 drives the first rotating part 11A of the first rotating shaft structure 10A to rotate.

At the time, the moving member 32 rotates to be perpendicular to the first connection member C1. Then, the second connection member C2 continues to move to drive the third rotating part 11B of the second rotating shaft structure 10B rotate. The second connection member C2 is parallel with the first connection member C1.

At the same time, since the whole hinge assembly 100B rotates and the position of the inner circle and the position of the outer circle are difference, the moving member 32 moves linearly via the configuration of the sliding slot 3221 and the pins 33. Furthermore, each moving member 32 moves to a position where the pin 33 moves to the end of the sliding slot 3221 near second connection member C2. Then the hinge assembly 100B rotates successfully.

In sum, the first rotating shaft structure 10A and the second rotating shaft structure 10B of the hinge assembly 100, 100A rotate with the bending of the flexible device M3. When the flexible device M3 bends towards the inner side, the moving members 22, 32 of each movable assembly 20, 30 move close to each other. When the flexible device M3 bends towards the outer side, the moving members 22, 32 of each movable assembly 20, 30 move far away from each other.

Thus, the flexible device M3 bends easily. The hinge assembly 100, 100A is connected with the electronic device M3. The hinge assembly 100, 100A is stretched or compressed adaptively in the bidirectional bending of the flexible device M3. The hinge assembly 100, 100A allows the flexible device M3 to bend greatly and meets the requirement of bidirectionally bending.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A hinge assembly, comprising:
   a first rotating shaft structure, including a first rotating part and a second rotating part, and the first rotating part coaxially rotates relative to the second rotating part;
   a first movable assembly, including a first connecting member and a first moving member movably connected to the first connecting member, the first connecting member includes a first segment and a second segment, the first moving member is slidably configured on the second segment of the first connecting member, and the first movable assembly is connected to the first rotating part via the first connecting member to rotate with the first rotating part simultaneously;
   a second movable assembly coupled to the first movable assembly via the first rotating shaft structure, the second movable assembly including a second connecting member and a second moving member movably connected to the second connecting member, the second connecting member includes a first segment and a second segment, the second moving member is slidably configured on the second segment of the second connecting member, and the second movable assembly is connected to the second rotating part via the second moving member to rotate with the second rotating part simultaneously;
   a second rotating shaft structure, including a third rotating part and a fourth rotating part, and the third rotating part coaxially rotates relative to the fourth rotating part; and
   a third movable assembly coupled to the second movable assembly via the second rotating shaft structure, the third movable assembly including a third connecting member and a third moving member movably connected to the third connecting member, the third connecting member includes a first segment and a second segment, the third moving member is slidably configured on the second segment of the third connecting member, and the third movable assembly is connected to the third rotating part via the second connecting member of the second movable assembly to rotate the third rotating part simultaneously.

2. The hinge assembly according to claim 1, wherein each of the first movable assembly, the second movable assembly, and the third movable assembly further includes a pin, respectively, and each of the first connecting member, the second connecting member, and the third connecting member further includes a slot hole, respectively, the pin of the first movable assembly is connected to the first moving member and is configured in the slot hole of the first connecting member, the pin of the second movable assembly is connected to the second moving member and is configured in the slot hole of the second connecting member, and the pin of the third movable assembly is connected to the third moving member and is configured in the slot hole of the third connecting member.

3. An electronic device, comprising:
   a hinge assembly, including:
      a first rotating shaft structure, including a first rotating part and a second rotating part, and the first rotating part coaxially rotates relative to the second rotating part;
      a first movable assembly, including a first connecting member and a first moving member movably connected to the first connecting member, the first connecting member includes a first segment and a second segment, the first moving member is slidably configured on the second segment of the first connecting member, and the first movable assembly is connected to the first rotating part via the first connecting member to rotate with the first rotating part simultaneously;
      a second movable assembly coupled to the first movable assembly via the first rotating shaft structure, the second movably assembly, including a second connecting member and a second moving member movably connected to the second connecting member, the second connecting member includes a first segment and a second segment, the second moving member is slidably configured on the second segment of the second connecting member, and the second movable assembly is connected via the second moving member to the second rotating part to rotate with the second rotating part simultaneously;

a second rotating shaft structure, including a third rotating part and a fourth rotating part, and the third rotating part coaxially rotates relative to the fourth rotating part; and a third movable assembly coupled to the second movable assembly via the second rotating shaft structure, the third movable assembly including a third connecting member and a third moving member movably connected to the third connecting member, the third connecting member includes a first segment and a second segment, the third moving member is slidably configured on the second segment of the third connecting member, and the third movable assembly is connected to the third rotating part via the second connecting member of the second movable assembly to rotate the third rotating part simultaneously;

a first casing, connected to the first movable assembly;

a second casing, connected to the third movable assembly; and a flexible device partly configured at the first casing and at the second casing, the flexible device is flattened or bent when the first casing and the second casing open or close.

* * * * *